United States Patent [19]

Gray

[11] Patent Number: 5,051,751

[45] Date of Patent: Sep. 24, 1991

[54] METHOD OF KALMAN FILTERING FOR ESTIMATING THE POSITION AND VELOCITY OF A TRACKED OBJECT

[75] Inventor: Roger L. Gray, King George, Va.

[73] Assignee: The United States of America as represented by the Secretary of the Navy, Washington, D.C.

[21] Appl. No.: 654,111

[22] Filed: Feb. 12, 1991

[51] Int. Cl.$^5$ .............................................. G01S 9/22
[52] U.S. Cl. ..................................... 342/107; 364/516
[58] Field of Search ................. 342/107, 106, 75, 354; 235/412, 413; 364/516

[56] References Cited

U.S. PATENT DOCUMENTS

| | | | |
|---|---|---|---|
| 4,179,696 | 12/1979 | Quesinberry et al. | 342/107 |
| 4,855,932 | 8/1989 | Cangiani et al. | 342/75 X |
| 4,883,244 | 11/1989 | Challoner et al. | 342/354 |

Primary Examiner—Mark Hellner
Attorney, Agent, or Firm—John D. Lewis; Kenneth E. Walden

[57] ABSTRACT

A method of Kalman filtering for estimating the position and velocity of a tracked object is provided. A Kalman filter is initialized with at least position and velocity error states in an inertial computational frame. Sensor measurements are used to develop a measured line-of-sight vector to the object. Matrix transformations are used to analytically rotate the sensor measurements into a measurement frame. The measurement frame is defined as having one axis pointing towards the estimated relative position of the object. The use of the measurement frame allows the method to be adaptable to any line-of-sight/computational frame geometry. Since statistical correlation of the measurements is not present in the measurement frame, the number of computations at each filter update is reduced.

8 Claims, 2 Drawing Sheets

METHOD OF KALMAN FILTERING FOR ESTIMATING THE POSITION AND VELOCITY OF A TRACKED OBJECT

ORIGIN OF THE INVENTION

The invention described herein was made in the performance of official duties by an employee of the Department of the Navy and may be manufactured, used, licensed by and for the Government for any governmental purposes without payment of any royalties thereon.

FIELD OF THE INVENTION

The present invention relates generally to Kalman filtering techniques and more particularly to a method of Kalman filtering that uses sensor measurements for estimating the position and velocity of a tracked object.

BACKGROUND OF THE INVENTION

In today's world of air and space travel, it has become increasingly important to accurately track an object's in-flight position and velocity. Typically, this is accomplished by one of either angle-only or angle-plus-range tracking methods, depending on the type of sensor used to track the object. Both methods make use of well-known Kalman filtering techniques for estimating the position and velocity of the tracked object. The basics of Kalman filtering are explained adequately in numerous references. By way of example, one such explanation is written by Roger M. Du Plessis in his paper "Poor Man's Explanation of Kalman Filtering", North American Aviation, Inc., June 1967. As explained by Du Plessis, Kalman filtering is an iterative process used to optimize measurement estimates.

In angle-only tracking, sensor measurements are expressed in terms of two angles—elevation and bearing—defined with respect to a computational frame of reference. In other words, the measurements are expressed in a spherical coordinate system. However, the spherical coordinate system has inherent disadvantages with respect to Kalman filters. For example, as the elevation angle approaches ±90 degrees, the imaginary line traced by changes in bearing becomes highly curved. This characteristic is similar to that of a circle of constant latitude which becomes highly curved near the north or south pole. The curvature conflicts with the Kalman filter assumption that the measurement process is linear. Furthermore, if the estimated elevation angle is exactly ±90 degrees, the Kalman filter cannot process bearing measurements at all since the filter's measurement matrix cannot be properly computed at these angles.

In conventional angle-plus-range tracking, sensor measurements include elevation, bearing and range expressed in the Cartesian coordinate frame. Accordingly, the Kalman filter does not suffer from the aforementioned problems associated with the spherical coordinate representation. However, when the elevation, bearing, and range measurements are expressed in the Cartesian frame, statistical correlation between the three measurement terms are introduced which greatly increases the number of numerical computations required for a filter update.

SUMMARY OF THE INVENTION

Accordingly, it is an object of the present invention to provide a method of Kalman filtering for estimating the position and velocity of a tracked object.

Another object of the present invention is to provide a method of Kalman filtering using sensor measurements expressed in a Cartesian coordinate system.

Still another object of the present invention is to provide a method of Kalman filtering that minimizes the number of computations required at each filter update to accurately determine the position and velocity of the tracked object.

In accordance with the present invention, a method of Kalman filtering is provided for estimating the position and velocity of a tracked object. A vehicle has a sensor mounted thereon for sensing the presence of the object. A Kalman filter is initialized with at least position and velocity error states. Trajectory models of the vehicle and object are provided to the Kalman filter and are used to derive a measurement frame of reference. The measurement frame is defined as having one axis pointing towards the estimated relative position of the object. Sensor measurements constituting a measured line-of-sight vector to the object are transformed into the measurement frame. The Kalman filter is then updated with the transformed sensor measurements for estimating the position and velocity of the tracked object.

BRIEF DESCRIPTION OF THE DRAWINGS

The foregoing objects and other advantages of the invention will be better understood from the following description taken with the accompanying drawings wherein like reference numerals refer to the same element throughout and wherein.

DETAILED DESCRIPTION OF THE INVENTION

The present invention is a method of Kalman filtering used for determining the position and velocity of a tracked object. It is apparent that there are a broad range of applications for the present invention. The method could be used to dock two space vehicles, determine the position of an airplane using radar measurements, or support a variety of other tasks where precise knowledge of the position and velocity of a tracked object is required. Although each application places specific requirements on the design of the Kalman filter, the fundamental method steps of the present invention are common to all applications. In general, the method of the present invention will improve the performance of any tracking filter.

Figure 1:
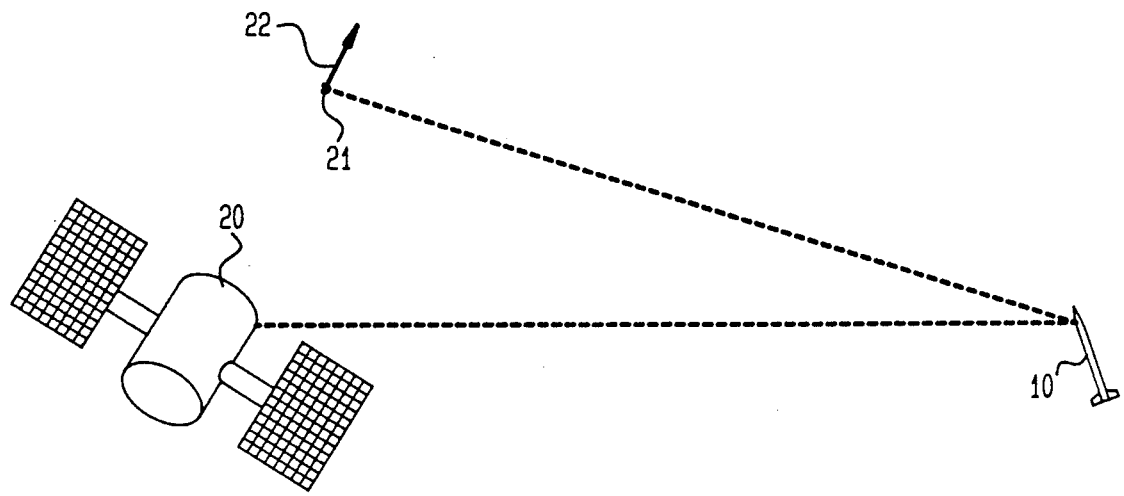
FIG. 1 is a diagrammatic view of an in-flight vehicle using the method of the present invention for determining the position and velocity of a tracked object.

Referring now to the drawings, and in particular to FIG. 1, a vehicle 10 has a sensor (not shown) mounted thereon for detecting the presence of an object 20. By way of example only, vehicle 10 may be a missile while object 20 may be a non-thrusting satellite. The sensor used may range from a simple optical sensor to a complex multiple radar system and is not a constraint on the present invention. It is only necessary that a direction vector toward the target is sensed.

Figure 2:
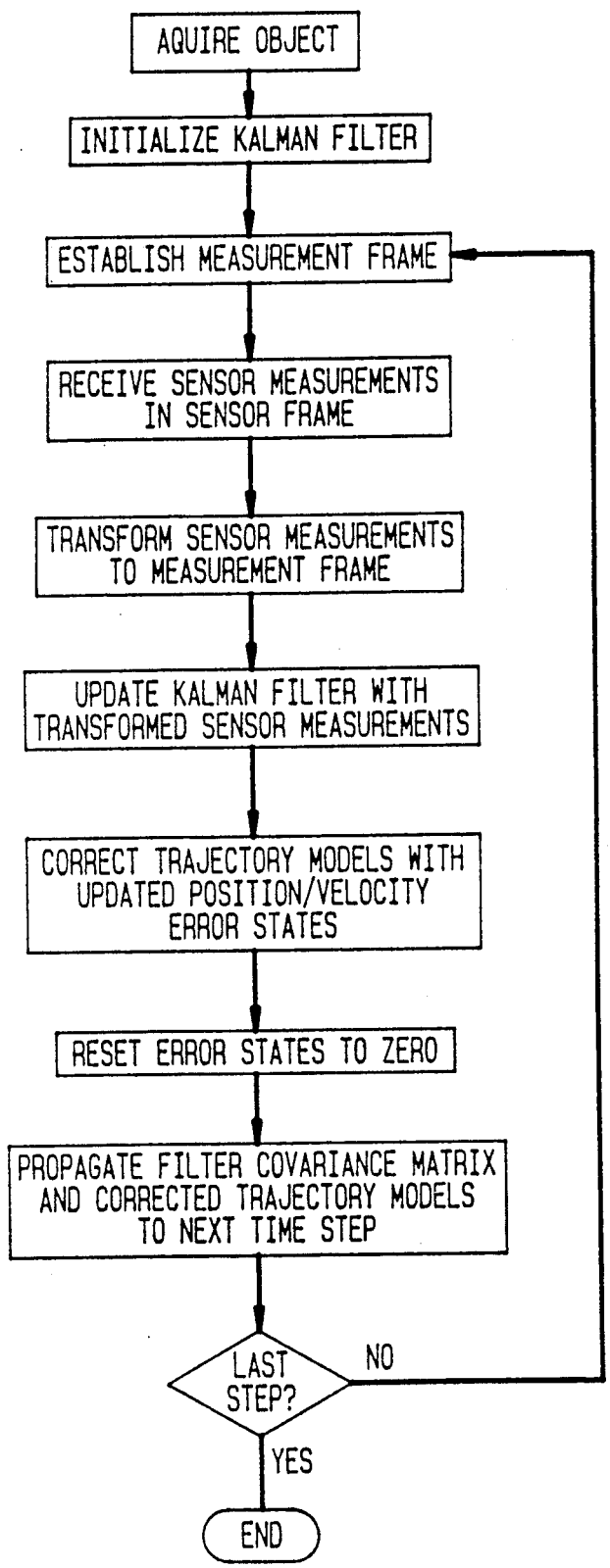
FIG. 2 is a flow diagram of the method used for determining the position and velocity of a tracked object according to the present invention.

The method uses the sensor measurements and Kalman filtering techniques to determine the estimated position 21 and estimated velocity, indicated by vector arrow 22, of object 20. The method will now be described with the aid of the flow diagram of FIG. 2. The method assumes that initial estimates of the position and velocity of the object are provided. After the object has been acquired by the vehicle's sensor, the first step involves initializing the Kalman filter's state vector and covariance matrix with a priori information. The state vector should include the states necessary to accurately model the measurement dynamics.

The Kalman filter used in the present invention requires only six relative states (vehicle-to-object) to model the error dynamics: three position error states and three velocity error states. The position and velocity error states are fundamental to tracking geometry. Accordingly, the description will only focus on these error states. However, the method of the present invention allows system error states to be easily inserted or deleted from the Kalman filter framework as required. For example, should a specific application require guidance drift or accelerometer error states, these values may be added to the framework of the Kalman filter. Note also that the error states represent errors in position and velocity not accounted for in trajectory models of the vehicle and object and do not represent an absolute difference in position and velocity.

Typically, a Kalman filter is initialized with a priori information only. However, since a first measurement often provides information which is many times better than a priori information, variance terms of the covariance matrix may be reduced by several orders of magnitude when the information from the first measurement is incorporated. For example, although down-range position information cannot be determined from just one measurement, cross-range position information about object 20 is known much more accurately after the first sensor measurement. Normally, information from the first sensor measurement is incorporated into the covariance matrix via a filter update. However, whenever a variance term is greatly reduced during the course of a single filter update, numerical errors are introduced. In order to avoid the introduction of such numerical errors, the method of the present invention constructs an initial covariance matrix that reflects the information from the first sensor measurement. Accordingly, while not a requirement of the present invention, the initial covariance matrix includes only a priori statistics for the down-range position variance while the cross-range position variance incorporates information from the first sensor measurement. Since the velocity terms of the state vector and covariance matrix can only be estimated over a period of time, they are initialized only with a priori information.

In order to directly incorporate information from the first sensor measurement into the initial covariance matrix, the initial covariance matrix is constructed in a frame having one axis pointing along a measured line-of-sight developed from the first sensor measurement. By doing so, the down-range and cross-range components of the covariance matrix can be handled independently. It is thereby possible to adjust the cross-range variance without affecting the down-range variance. The initial covariance matrix is then analytically rotated into the computational frame of the Kalman filter. The initial position estimate is then corrected to incorporate the relative cross-range position information from the first sensor measurement.

Figure 3:
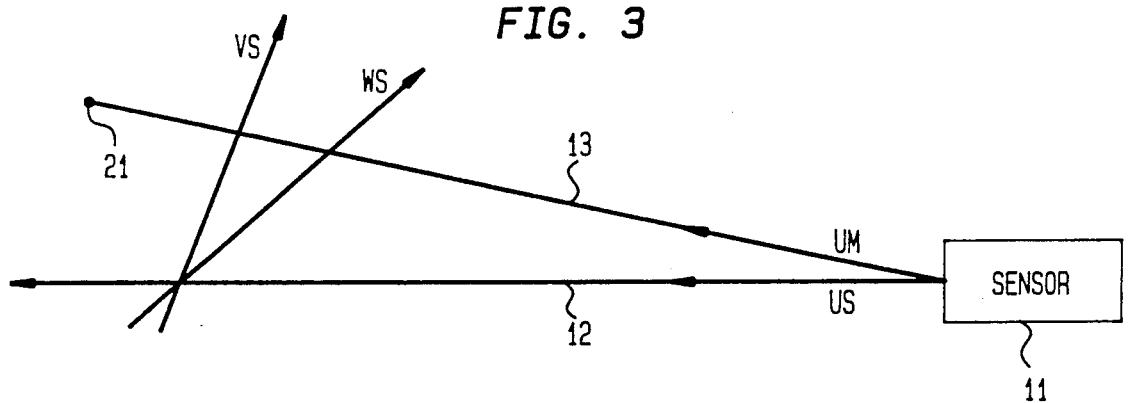
FIG. 3 depicts the relationship between the measurement and sensor frames used by the method of the present invention.

Before going further in the description, it is necessary to define the three frames of reference used by the method of the present invention. As shown in FIG. 3, a sensor frame of reference (hereinafter designated as the US frame) is defined as having a line-of-sight or US axis 12 along the nominal boresight of the sensor 11 (mounted on vehicle 10). The two axes perpendicular to the US axis are denoted VS and WS. In contrast, all states of the state vector are represented in a computational frame of reference (hereinafter designated as the UC frame). The UC frame is an arbitrary inertial frame. The important feature of the UC frame is that it is an inertial frame and therefore simplifies the time update of the Kalman filter. The three axes of the UC frame are denoted UC, VC and WC. Finally, since the UC frame is not the natural frame for measurement updates, a measurement frame of reference (hereinafter designated as the UM frame) is defined and used by the method of the present invention.

The UM frame is defined such that one axis (the UM axis) is an expected line-of-sight 13 pointing towards the estimated relative position 21 of the object and the two axes perpendicular to the UM axis are the VM and WM axes. Thus, the UM frame is dependent on the current relative position of the object. It is not necessary for the UC and UM frames to coincide. The UC frame remains inertial while the UM frame changes to be consistent with the current relative position between the sensor 11 and the object.

The UM frame can be derived regardless of the technique used to keep track of the position and velocity of the vehicle and object. In the conventional tracking filter, the trajectories are implicitly modeled within the Kalman filter. In the preferred embodiment, the trajectories are explicitly modeled separate from the Kalman filter. In either case, the relative position between the vehicle and object can be computed and, consequently, the UM frame can be derived.

The sensor measurements are received in the sensor frame of reference as mentioned above. Before processing can begin, however, the sensor measurements must be transformed or analytically rotated into the measurement frame. The resulting measurement terms represent the difference between the measured and expected line-of-sight, expressed in the UM frame. In order to facilitate an understanding of the present invention, the following description will assume that optical sensor measurements are being used. Accordingly, two optical sensor measurements are expressed as follows:

$$ZVS = \frac{(VS \text{ component of relative position of object})}{(US \text{ component of relative position of object})} \quad (1)$$

$$ZWS = \frac{(WS \text{ component of relative position of object})}{(US \text{ component of relative position of object})} \quad (2)$$

It then follows that the vector (1, ZVS, ZWS) points in the direction of the measured line-of-sight to the object in the sensor frame. The vector (1, ZVS, ZWS) is rotated into the UM frame as (ZUMX, ZVMX, ZWMX)

$$\begin{bmatrix} ZUMX \\ ZVMX \\ ZWMX \end{bmatrix} = (TUS2UM_{3\times3}) \begin{bmatrix} 1 \\ ZVS \\ ZWS \end{bmatrix} \quad (3)$$

where $TUS2UM_{3\times3}$ is the transformation matrix used to relate the US frame to the UM frame. The vector 24 (ZUMX, ZVMX, ZWMX) thus points in the direction of the measured line-of-sight to the object in the UM frame. It follows then that a sensor in the UM frame would have taken the following measurements:

$$ZVM = \frac{ZVMX}{ZUMX} \quad (4)$$

$$ZWM = \frac{ZWMX}{ZUMX} \quad (5)$$

Thus, ZVM and ZWM are the transformed measurements with respect to the estimated relative position of the object and are the terms that will be used in the measurement update.

The Kalman filter estimates the position and velocity of the vehicle and object using the transformed measurement information in a measurement update process. The measurement update process involves computing the measurement matrix used in Kalman filtering techniques and updating the Kalman filter with respect to the transformed sensor measurements. The equations used for the update are well known in the art and may be found in "Applied Optimal Estimation", Table 4.2-1, edited by Arthur Gelb, The MIT Press, 1974, which is incorporated herein by reference.

Figure 4:
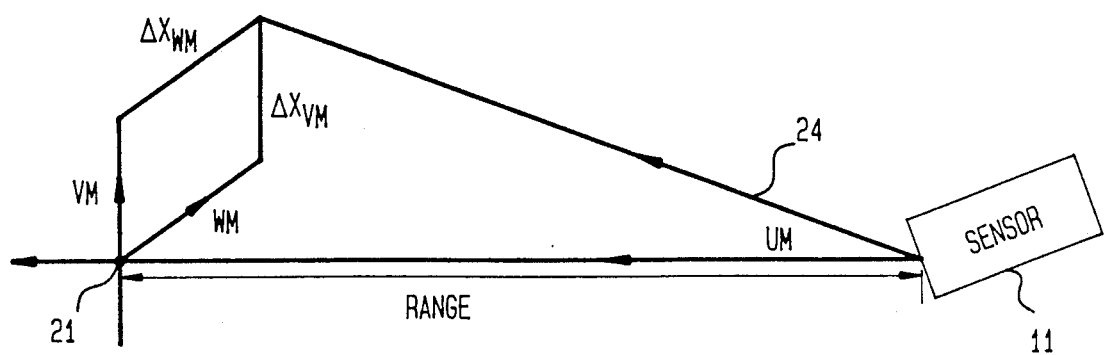
FIG. 4 depicts the relationship between the position errors and transformed sensor measurements.

The measurement matrix is naturally defined in the UM frame. The relationships between the position errors ($\Delta X_{um}$, $\Delta X_{vm}$, $\Delta X_{wm}$) and the transformed sensor measurements (ZVM, ZWM) will now be described with the aid of FIG. 4. Mathematically, $$ZVM = \frac{\Delta X_{vm}}{RANGE_{EST}} \quad (6)$$

$$ZWM = \frac{\Delta X_{wm}}{RANGE_{EST}} \quad (7)$$

$$\begin{bmatrix} ZVM \\ ZWM \end{bmatrix} = \begin{bmatrix} 0 & 1/RANGE_{EST} & 0 \\ 0 & 0 & 1/RANGE_{EST} \end{bmatrix} \begin{bmatrix} \Delta X_{um} \\ \Delta X_{vm} \\ \Delta X_{wm} \end{bmatrix} \quad (8)$$

where $RANGE_{EST}$ is the best estimate of the range to the object. In general, the actual range is not known so the value of $RANGE_{EST}$ must be based on the estimated trajectories of the vehicle and object. Recalling that the state vector of the filter is defined in the UC frame, a frame transformation from the UC to the UM frame must be incorporated into the measurement matrix to facilitate the measurement update process. To illustrate this, let $TUC2UM_{3\times3}$ denote the transformation matrix relating the UC frame to the UM frame. The relationship then between the state vector in the UC and the UM frames can be written as follows:

$$\begin{bmatrix} \Delta X \\ \Delta V \end{bmatrix}_{(UM\ FRAME)} = \quad (9)$$

$$\begin{bmatrix} TUC2UM_{3\times3} & 0_{3\times3} \\ 0_{3\times3} & TUC2UM_{3\times3} \end{bmatrix} \begin{bmatrix} \Delta X \\ \Delta V \end{bmatrix}_{(UC\ FRAME)}$$

Since the measurement matrix relates the transformed sensor measurements to the state vector in the UC frame, it is defined by combining equations (8) and (9). At this point, normal Kalman filtering techniques are used to complete the update of the Kalman filter. If the sensor measurements are radar measurements that include actual range measurements ($RANGE_{MEAS}$), equation (8) is replaced by:

$$\begin{bmatrix} RANGE_{MEAS} \\ RANGE_{MEAS} \times ZVM \\ RANGE_{MEAS} \times ZWM \end{bmatrix} = \begin{bmatrix} 1 & 0 & 0 \\ 0 & 1 & 0 \\ 0 & 0 & 1 \end{bmatrix} \begin{bmatrix} \Delta X_{UM} \\ \Delta X_{VM} \\ \Delta X_{WM} \end{bmatrix} \quad (10)$$

where ZVM and ZWM are computed using the measured line-of-sight vector from the radar measurements.

The updated Kalman filter is then used to correct the guidance estimate of the vehicle and object trajectories to reflect the trajectory information estimated by the filter in the current time step. Since the estimated errors are now incorporated into the vehicle and object trajectories, the position and velocity errors of the filter state vector are reset to zero. Retaining the errors in the state vector would result in double bookkeeping.

The filter covariance matrix and new trajectory models are then propagated to the time associated with the next time step in accordance with the nominal acceleration profile of the vehicle and object. Depending on the application, the updated covariance matrix may reflect the effect of gravity feedback over the time step. The state vector does not have to be updated for the next time step since the velocity and position error states have been reset to zero. The process then repeats itself as the measurement frame is once again established using the new trajectory models.

The filter estimates errors in the relative position and velocity of the vehicle and the object. The relative position and velocity correction is then applied to either the trajectory of the vehicle or to the trajectory of the object. Either correction is consistent with the filter information. The correction is applied to the trajectory that is more likely to exhibit a position or a velocity error.

The advantages of the present invention are numerous. Unlike the conventional angle-only tracking filter, a Kalman filter operating according to the disclosed method benefits from sensor measurements expressed in the Cartesian coordinate system. Consequently, the computation of the measurement matrices is accurate for any line-of-sight/computation frame geometry. The computation of the measurement matrices does not degrade if the image of the object is close to the polar axis of the computational frame. The disclosed method is also more computationally efficient than that used by the conventional angle-plus-range filter. Since the disclosed method expresses the measurements in the measurement frame, the measurements are not statistically correlated. This reduces the number of computations required for each filter update, which is an important consideration in Kalman filter design. In addition, by incorporating the information from the first sensor measurement into the initial covariance matrix and trajectory estimates, the numerical errors associated with the filter process are minimized.

The disclosed method can be applied to a wide range of applications. Conventional tracking filters only compute the relative position and velocity of the object and vehicle. This limits the application of conventional tracking filters since the dynamics of the object cannot always be determined from the relative position and velocity estimates. For example, aerodynamic drag is a function of the absolute, not the relative velocity of the object. The disclosed method solves this problem by explicitly estimating the trajectory of the tracked object. Thus, trajectory dynamics of the object can be based directly on the estimated position and velocity of the object.

Thus, although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. In a tracking system having a sensor mounted on a vehicle for sensing the presence of an object, a method of Kalman filtering for estimating the position and velocity of the object, comprising the steps of:
   a. initializing a Kalman filter with at least position and velocity error states;
   b. providing trajectory models of the vehicle and object;
   c. establishing a measurement frame of reference for the vehicle and object using the trajectory models wherein the measurement frame is defined as having one axis pointing towards the estimated relative position of the object;
   d. receiving sensor measurements to develop at least a measured line-of-sight vector to the object;
   e. transforming the sensor measurements into the measurement frame;
   f. updating the Kalman filter with the transformed sensor measurements for estimating the position and velocity of the tracked object;
   g. correcting the trajectory models based on the estimated position and velocity;
   h. resetting the position and velocity error states to zero;
   j. propagating the trajectory models and the filter's covariance matrix to the next time step; and
   k. performing steps (c) through (j) as an iterative Kalman filter process.

2. A method as in claim 1 further including the step of explicitly measuring range to the object.

3. A method as in claim 1 wherein said step of initializing includes the steps of:
   a. providing a priori position and velocity error state information;
   b. receiving a first measurement from the sensor, the first sensor measurement including relative cross-range position information about the object;
   c. constructing the Kalman filter's covariance matrix to reflect the a priori position error state information and the relative cross-range position information from the first sensor measurement; and
   d. correcting the initial position estimate in accordance with the first sensor measurement.

4. A method as in claim 1 wherein said step of initializing includes the steps of:
   a. providing a priori position and velocity error state information;
   b. receiving a first measurement from the sensor to establish the measured line-of-sight vector to the object, the first sensor measurement including relative cross-range position information about the object;
   c. constructing a frame of reference having one axis along the measured line-of-sight vector;
   d. constructing the Kalman filter's covariance matrix relative to the constructed frame of reference to reflect the a priori position error state information and the relative cross-range position information from the first sensor measurement;
   e. analytically rotating the covariance matrix into the Kalman filter's inertial computational frame; and
   f. correcting the trajectory models in accordance with the first sensor measurement.

5. A method as in claim 1 wherein the Kalman filter's state vector and covariance matrix are in an inertial computational frame of reference and wherein said step of updating includes the step of computing the Kalman filter's measurement matrix using a transformation matrix to relate the measurement frame to the inertial computational frame.

6. In a tracking system having a sensor mounted on a vehicle for sensing the presence of an object, a method of Kalman filtering for estimating the position and velocity of the object, comprising the steps of:
   a. providing the tracking system with initial estimates of velocity error state information;
   b. initializing a Kalman filter with a priori position and velocity error state information;
   c. receiving a first measurement from the sensor, the first sensor measurement including relative cross-range position information about the object;
   d. constructing the Kalman filter's covariance matrix to reflect the a priori position error state information and the relative cross-range position information from the first sensor measurement; and
   e. correcting the initial position estimate in accordance with the first sensor measurement;
   f. deriving a measurement frame of reference for the vehicle and object wherein the measurement frame is defined as having one axis pointing towards the estimated relative position of the object;
   g. receiving sensor measurements to develop at least a measured line-of-sight vector to the object;
   h. transforming the sensor measurements into the measurement frame; and
   i. updating the Kalman filter with the transformed sensor measurements for estimating the position and velocity of the tracked object.

7. In a tracking system having a sensor mounted on a vehicle for sensing the presence of an object, a method of Kalman filtering for estimating the position and velocity of the object, comprising the steps of:
   a. providing the tracking system with initial estimates of position and velocity of the object;
   b. initializing a Kalman filter with a priori position and velocity error state information;
   c. receiving a first measurement from the sensor to establish the measured line-of--sight vector to the object the first sensor measurement including relative cross-range position information about the object;

d. constructing a frame of reference having one axis along the measured line-of-sight vector;
e. constructing the Kalman filter's covariance matrix relative to the constructed frame of reference to reflect the a priori position error state information and the relative cross-range position information from the first sensor measurement;
f. analytically rotating the covariance matrix into the Kalman filter's inertial computational frame;
g. correcting the initial position estimate in accordance with the first sensor measurement;
h. deriving a measurement frame of reference for the vehicle and object wherein the measurement frame is defined as having one axis pointing towards the estimated relative position of the object;
i. receiving sensor measurements to develop at least a measured line of sight vector to the object;
j. transforming the sensor measurements into the measurement frame; and
k. updating the Kalman filter with the transformed sensor measurements for estimating the position and velocity of the tracked object.

8. In a tracking system having a sensor mounted on a vehicle for sensing the presence of an object, a method of Kalman filtering for estimating the position and velocity of the object, comprising the steps of:

a. referencing the Lakman filter's state vector and covariance matrix in an inertial computational frame of reference;
b. providing the tracking system with initial estimates of position and velocity of the object;
c. initializing the Kalman filter with at least position and velocity error states;
d. deriving a measurement frame of reference for the vehicle and object wherein the measurement frame is defined as having one axis pointing towards the estimated relative position of the object;
e. receiving sensor measurements to develop at least a measured line-of-sight vector to the object;
f. transforming the sensor measurements into the measurement frame;
g. updating the Kalman filter with the tansformed sensor measurements and computing the Kalman filter's measurement magic using a transformation matrix to relate the measurement frame to the inertial computational frame;
h. providing trajectory models of the vehicle and object;
i. correcting the trajectory models based on the estimated position and velocity error states;
j. resetting the position and velocity error states to zero; and
propagating the trajectory models and the filter's covariance matrix to the next time step.

* * * * *